(12) United States Patent
Jang et al.

(10) Patent No.: US 12,464,644 B2
(45) Date of Patent: Nov. 4, 2025

(54) STORAGE DEVICE AND PRINTED CIRCUIT BOARD FOR SOLID STATE DRIVE

(71) Applicant: SK hynix Inc., Gyeonggi-do (KR)

(72) Inventors: Byoung Ick Jang, Gyeonggi-do (KR); Jung Cheol Yim, Gyeonggi-do (KR); Kwang Min Nam, Gyeonggi-do (KR); Jun Chang Yu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 413 days.

(21) Appl. No.: 18/074,006

(22) Filed: Dec. 2, 2022

(65) Prior Publication Data

US 2023/0380061 A1 Nov. 23, 2023

(30) Foreign Application Priority Data

May 20, 2022 (KR) .................. 10-2022-0062273

(51) Int. Cl.
*H05K 1/11* (2006.01)
*H01L 25/18* (2023.01)
*H05K 1/18* (2006.01)

(52) U.S. Cl.
CPC .............. *H05K 1/115* (2013.01); *H01L 25/18* (2013.01); *H05K 1/181* (2013.01); *H05K 2201/09445* (2013.01); *H05K 2201/10159* (2013.01)

(58) Field of Classification Search
CPC ................ H05K 1/115; H05K 1/181; H05K 2201/09445; H05K 2201/10159; H01L 25/18
USPC ........................................................ 361/791
See application file for complete search history.

(56) References Cited

U.S. PATENT DOCUMENTS

| | | | |
|---|---|---|---|
| 2014/0252588 A1* | 9/2014 | Aoki ................. | H01L 23/42 |
| | | | 257/713 |
| 2017/0094789 A1* | 3/2017 | Park ................. | H05K 1/113 |
| 2018/0026022 A1* | 1/2018 | Lee .................. | H01L 23/5386 |
| | | | 257/659 |
| 2021/0043557 A1* | 2/2021 | Lee .................. | H01L 23/5385 |
| 2022/0101893 A1* | 3/2022 | Park ................. | G11C 7/20 |

FOREIGN PATENT DOCUMENTS

| KR | 10-2018-0064994 A | 6/2018 |
|---|---|---|
| KR | 10-2043369 B1 | 11/2019 |

* cited by examiner

*Primary Examiner* — Andargie M Aychillhum
(74) *Attorney, Agent, or Firm* — IP & T GROUP LLP

(57) ABSTRACT

Provided herein may be a storage device and a printed circuit board for a solid state drive. The storage device may include a substrate including a conductive via, a plurality of memory devices mounted on a top surface of the substrate, a memory controller mounted on the top surface and electrically connected to the conductive via, and a port formed on a bottom surface of the substrate and electrically connected to the conductive via and a host device.

20 Claims, 8 Drawing Sheets

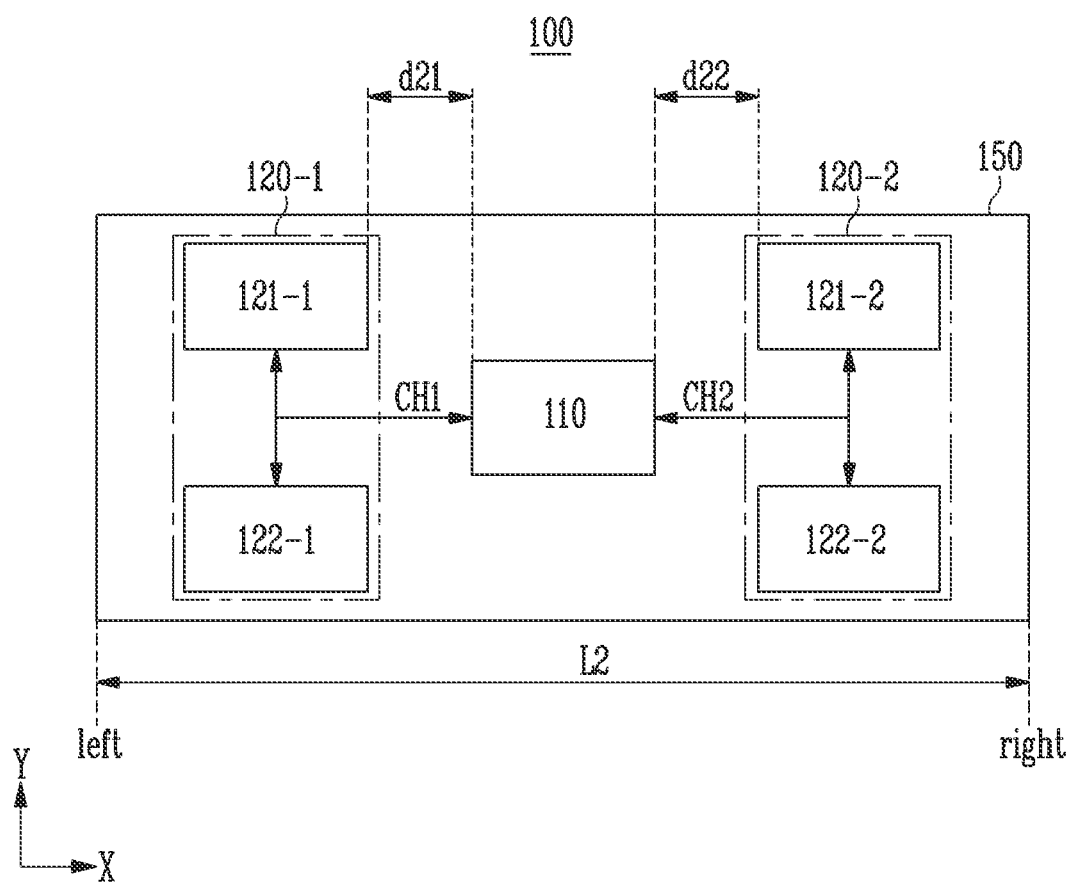

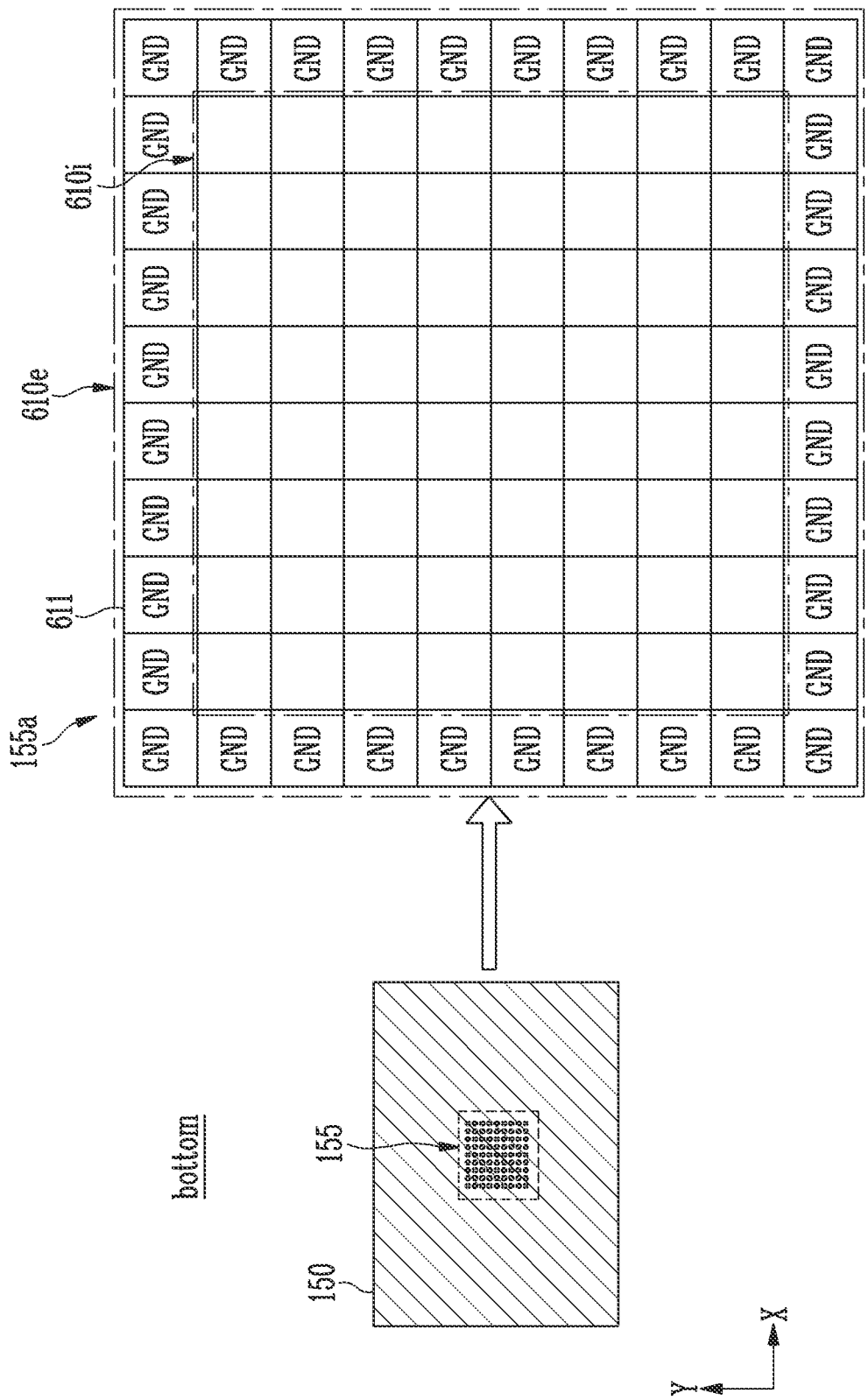

FIG. 5B

STORAGE DEVICE AND PRINTED CIRCUIT BOARD FOR SOLID STATE DRIVE

CROSS-REFERENCE TO RELATED APPLICATION

The present application claims priority under 35 U.S.C. § 119(a) to Korean patent application number 10-2022-0062273, filed on May 20, 2022, the entire disclosure of which is incorporated herein by reference.

BACKGROUND

Field of Invention

Various embodiments of the present disclosure relate to an electronic device, and more particularly to a storage device and a printed circuit board for a solid state drive.

Description of Related Art

A storage device is an electronic device, which stores data or outputs stored data in response to a request from a host device.

The storage device may communicate with the host device based on a peripheral component interconnect Express (PCIe) scheme. PCIe is a high bandwidth expansion bus, and a data transfer rate is required to be increased as the generation of PCIe becomes higher.

Accordingly, research into various schemes for reducing signal loss and improving a transfer rate has been conducted.

SUMMARY

Various embodiments of the present disclosure are directed to a storage device and a printed circuit board for a solid state drive, which minimize signal loss and improve a transfer rate.

An embodiment of the present disclosure may provide for a storage device. The storage device may include a substrate including a conductive via, a plurality of memory devices mounted on a top surface of the substrate, a memory controller mounted on the top surface and electrically connected to the conductive via, and a port formed on a bottom surface of the substrate and electrically connected to the conductive via and a host device.

An embodiment of the present disclosure may provide for a printed circuit board for a solid state drive. The printed circuit board may include a substrate including a conductive via, a connection terminal formed on a top surface of the substrate to electrically couple the conductive via and the memory controller to each other, and a port formed on a bottom surface of the substrate to electrically couple the conductive via and a host device to each other.

BRIEF DESCRIPTION OF THE DRAWINGS

FIG. 4 is a diagram illustrating a top surface of a substrate according to an embodiment of the present disclosure.

FIG. 5A is a diagram illustrating a bottom surface of a substrate and a pin array according to an embodiment of the present disclosure.

FIG. 5B is a diagram illustrating a pin array according to an embodiment of the present disclosure.

DETAILED DESCRIPTION

Specific structural or functional descriptions of the embodiments of the present disclosure introduced in this specification are provided as examples to describe embodiments according to the concept of the present disclosure. The embodiments according to the concept of the present disclosure may be practiced in various forms, and should not be construed as being limited to the embodiments described in the specification.

Figure 1:
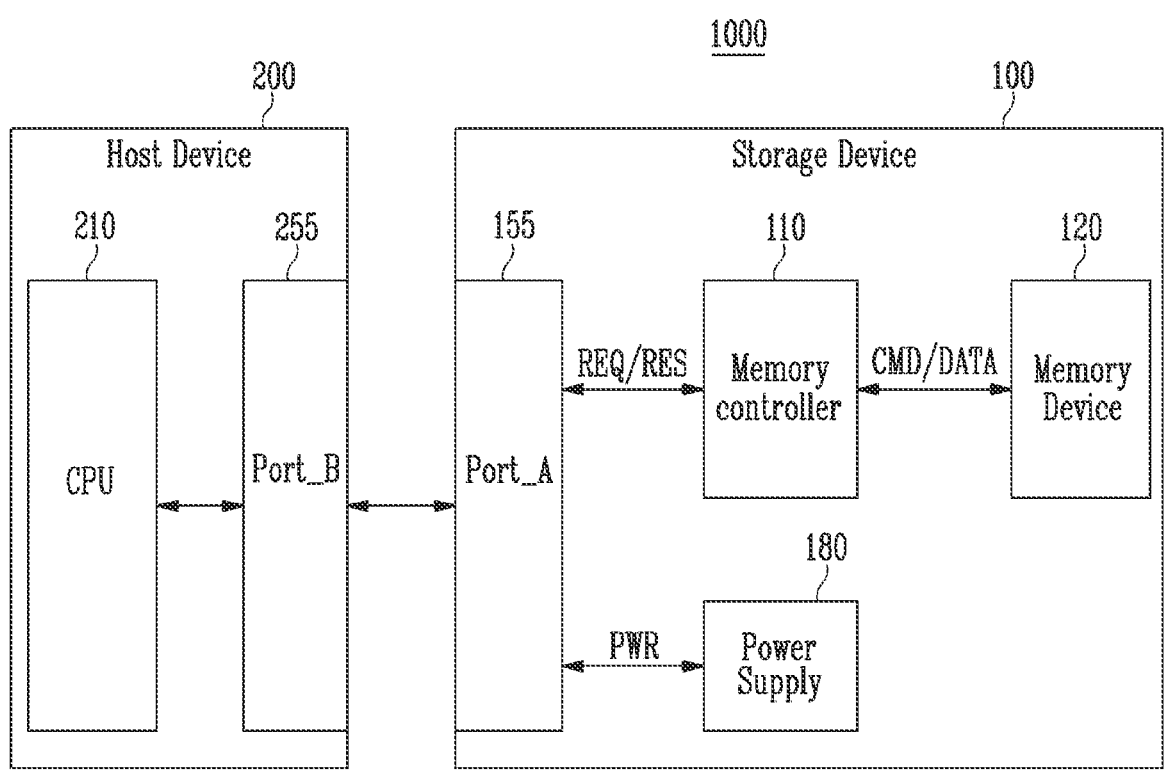
FIG. 1 is a diagram illustrating an electronic device according to an embodiment of the present disclosure.

FIG. 1 is a diagram illustrating an electronic device according to an embodiment of the present disclosure.

Referring to FIG. 1, an electronic device 1000 according to an embodiment of the present disclosure may include a storage device 100 and a host device 200. The electronic device 1000 may be one of various electronic devices, such as a desktop computer, a laptop computer, a smartphone, a game console, a television (TV), a tablet computer, and a wearable device. The storage device 100 may be a solid state disk or a solid state drive (SSD).

The storage device 100 may include a memory controller 110, a memory device 120, and a first port 155.

The memory controller 110 may communicate with the host device 200 based on a communication interface. For example, the communication interface may be a peripheral component interconnect express (PCIe) interface, a nonvolatile memory express (NVMe) interface, or the like. For this, the memory controller 110 may be coupled to the host device 200 through the first port 155 (Port A) of the storage device 100 and a second port 255 (Port B) of the host device 200.

The memory controller 110 may receive a signal from the host device 200 or transmit a signal to the host device 200, through the first port 155, For example, the memory controller 110 may receive a request signal REQ from the host device 200, The request signal REQ may be a signal indicating one of a data write request, a data read request, and a data erase request. For example, the memory controller 110 may transmit a response signal RES to the host device 200. The response signal RES may be one of a signal indicating the completion of an operation and data corresponding to a data read request.

The memory controller 110 may communicate with the memory device 120 based on a communication interface. For example, the communication interface may be an open NAND flash interface (ONFI) or the like. For this, the memory controller 110 may be coupled to the memory device 120 through a channel.

The memory controller 110 may control the memory device 120, The memory controller 110 may transmit a signal to the memory device 120 or receive a signal from the memory device 120 through the channel.

In detail, the memory controller 110 may transmit a command signal CMD for controlling the operation of the memory device 120 to the memory device 120. The command signal CMD may be one of a program command instructing data DATA to be stored, a read command instructing stored data DATA to be read, and an erase command instructing the stored data DATA to be erased. For example, the memory controller 110 may transmit the program command and data DATA to the memory device 120. For example, the memory controller 110 may transmit the read command to the memory device 120, and may receive data DATA from the memory device 120, For example, the memory controller 110 may transmit the erase command to the memory device 120, and the memory device 120 may erase stored data DATA.

The memory device 120 may store data. The memory device 120 may be implemented as a semiconductor memory device. For example, the memory device 120 may be a nonvolatile semiconductor memory device such as a NAND flash memory or a vertical NAND flash memory.

The memory device 120 may include a plurality of memory blocks. Each memory block may include a plurality of pages. One page may include a plurality of memory cells. That is, the memory device 120 may include a plurality of memory cells. Each memory cell may be a minimum unit in which data is stored. In an embodiment, the memory cell may be implemented using a transistor including a gate, an insulating layer, and a floating gate. For example, when a program voltage is applied to the gate of the memory cell, electrons may be stored in the floating gate of the memory cell through a tunneling phenomenon. In this case, the threshold voltage of the memory cell may be changed depending on the number of electrons stored in the floating gate. The threshold voltage of the memory cell may belong to any of a plurality of program states having different voltage ranges. The program state of the memory cell may indicate the value of data stored in the memory cell.

The first port 155 may be coupled to the second port 255 of the host device 200. The first port 155 may transfer a signal received from the second port 255 of the host device 200 to the memory controller 110. The first port 155 may transfer a signal received from the memory controller 110 to the second port 255 of the host device 200.

In an embodiment, the storage device 100 may further include a power supply 180. The power supply 180 may receive external power PWR from the host device 200 through the first port 155. The power supply 180 may supply internal power to the storage device 100. That is, each of the memory controller 110 and the memory device 120 may be operated using the internal power supplied by the power supply 180.

The host device 200 may include a central processing unit (CPU) 210 and the second port 255.

The central processing unit (CPU) 210 may control the overall operation of the host device 200. The central processing unit (CPU) 210 may transmit a request signal REQ to the storage device 100 through the second port 255. As a response to the request, the central processing unit 210 may receive a response signal RES from the storage device 100 through the second port 255.

In accordance with an embodiment of the present disclosure, the location of the first port 155 of the storage device 100 may be changed, and thus the loss of the transmitted signal may be minimized. Below, a conventional storage device will be described for a comparison with the embodiment of the present disclosure.

Figure 2A:
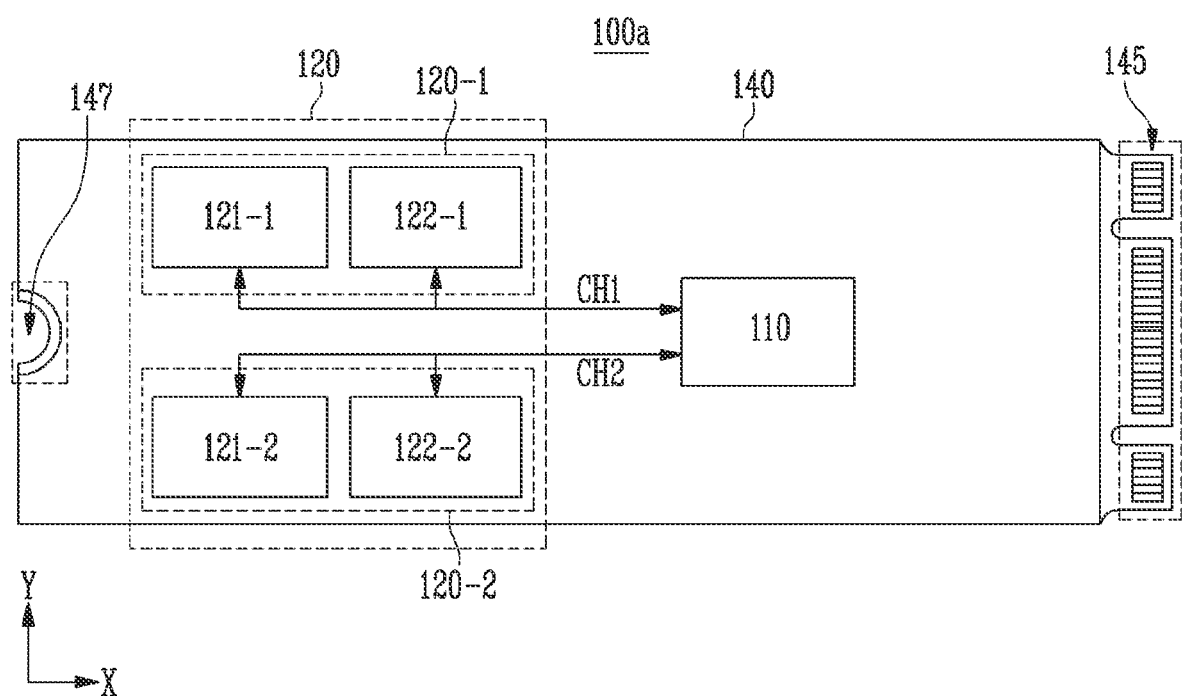
FIGS. 2A and 2B are diagrams illustrating a conventional storage device.
Figure 2B:
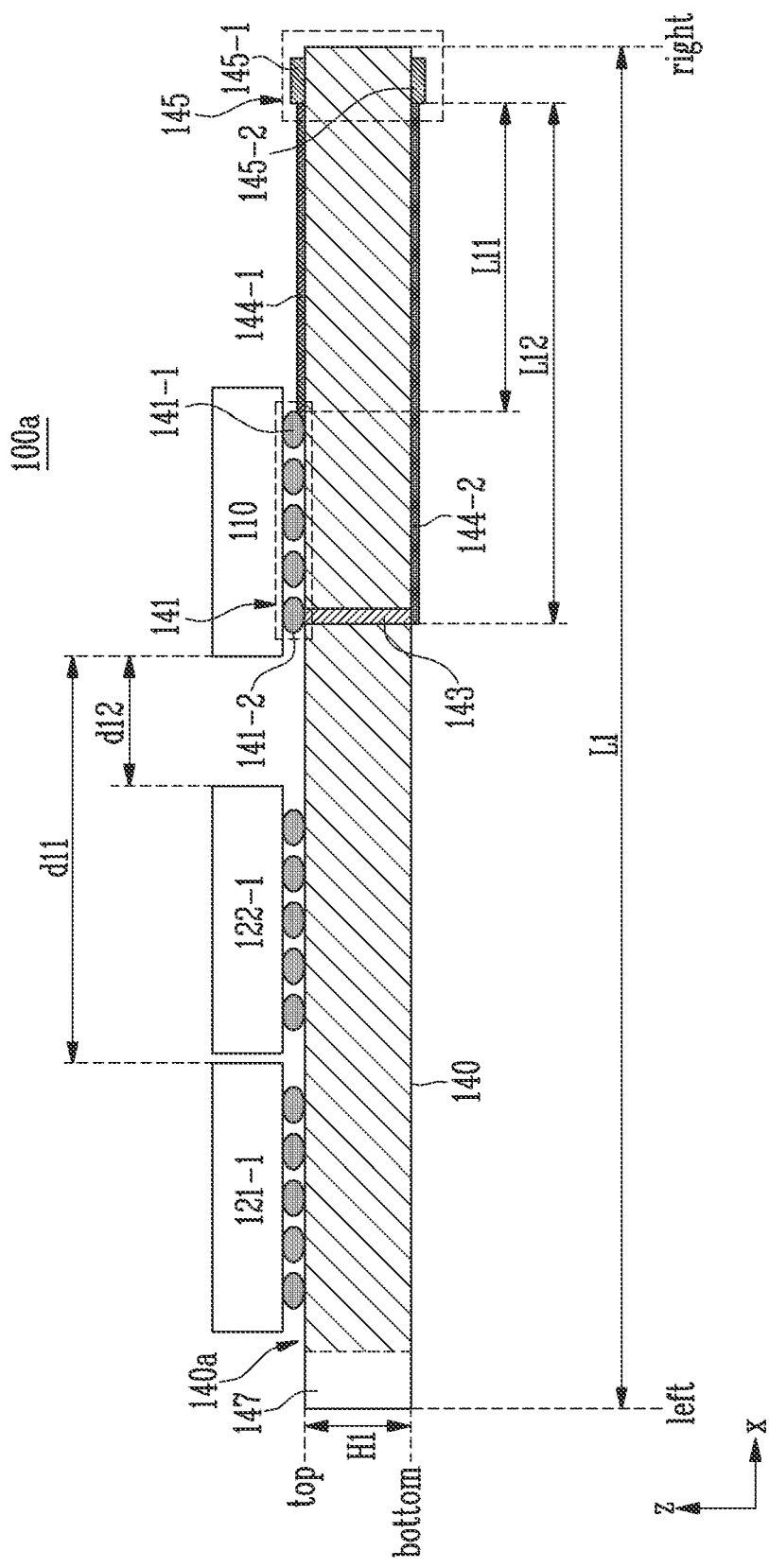

FIGS. 2A and 2B are diagrams illustrating the conventional storage device.

Referring to FIGS. 2A and 2B, a conventional storage device 100a includes a memory controller 110, memory devices 120, and a substrate 140 on which the memory controller 110 and the memory devices 120 are mounted. A port 145 may be formed in a right portion of the substrate 140, and a coupler 147 may be formed in a left portion of the substrate 140. The conventional storage device 100a may be an M.2 standard SSD.

In the case of the conventional scheme, the port 145 is formed in the right portion of the substrate 140. In this case, in the state in which the port 145 of the storage device 100a is inserted into the port of the host device 200 in the right direction, a screw is threaded into the coupler 147 of the storage device 100a and the coupler of the host device 200, thus enabling the storage device 100a to be fastened to the host device 200.

In order for the memory controller 110 of the storage device 100a and the host device 200 to communicate with each other, a channel should be formed between the memory controller 110 and the host device 200. That is, the memory controller 110 and the host device 200 should be electrically connected to each other. For this, signal lines 144-1 and 144-2 are formed between the memory controller 110 and the port 145. In this case, the length of the channel between the memory controller 110 and the host device 200 may be the length L11 of the first signal line 144-1, or the sum of the length L12 of the second signal line 144-2 and the height H1 of the substrate 140. Here, the first signal line 144-1 may couple a first connection terminal 141-1 and a port 145-1 on a top surface of the substrate 140 to each other, and the second signal line 144-2 may couple a conductive via 143, coupled to a second connection terminal 141-2, and a port 145-2 on a bottom surface of the substrate 140 to each other.

A problem arises in that, as the length of the channel between the memory controller 110 and the host device 200 is longer, signal loss is increased, and a signal transfer rate is decreased. Also, because other electronic elements, such as a RAM and a power supply 180, are mounted in an area between the memory controller 110 and the port 145, on the top surface of the substrate 140, there is a limitation in shortening the length of the channel. Furthermore, according to the transmission order of signals such as for the host device 200, the memory controller 110, and the memory devices 120, the memory controller 110 should be disposed closer to the port 145 located in the right portion of the substrate 140, In this case, because distances d11 and d12 between the memory controller 110 and the plurality of memory devices 120 (121-1 and 122-1) are not uniform, deviations may occur with regard to signal characteristics between the memory controller 110 and the memory devices 120.

In accordance with the present disclosure, the length of the channel may be shortened by solving the limitation or problem, thus minimizing signal loss and improving a signal transfer rate. Hereinafter, embodiments of the present disclosure will be described in detail with its reference to the attached drawings.

Figure 3:
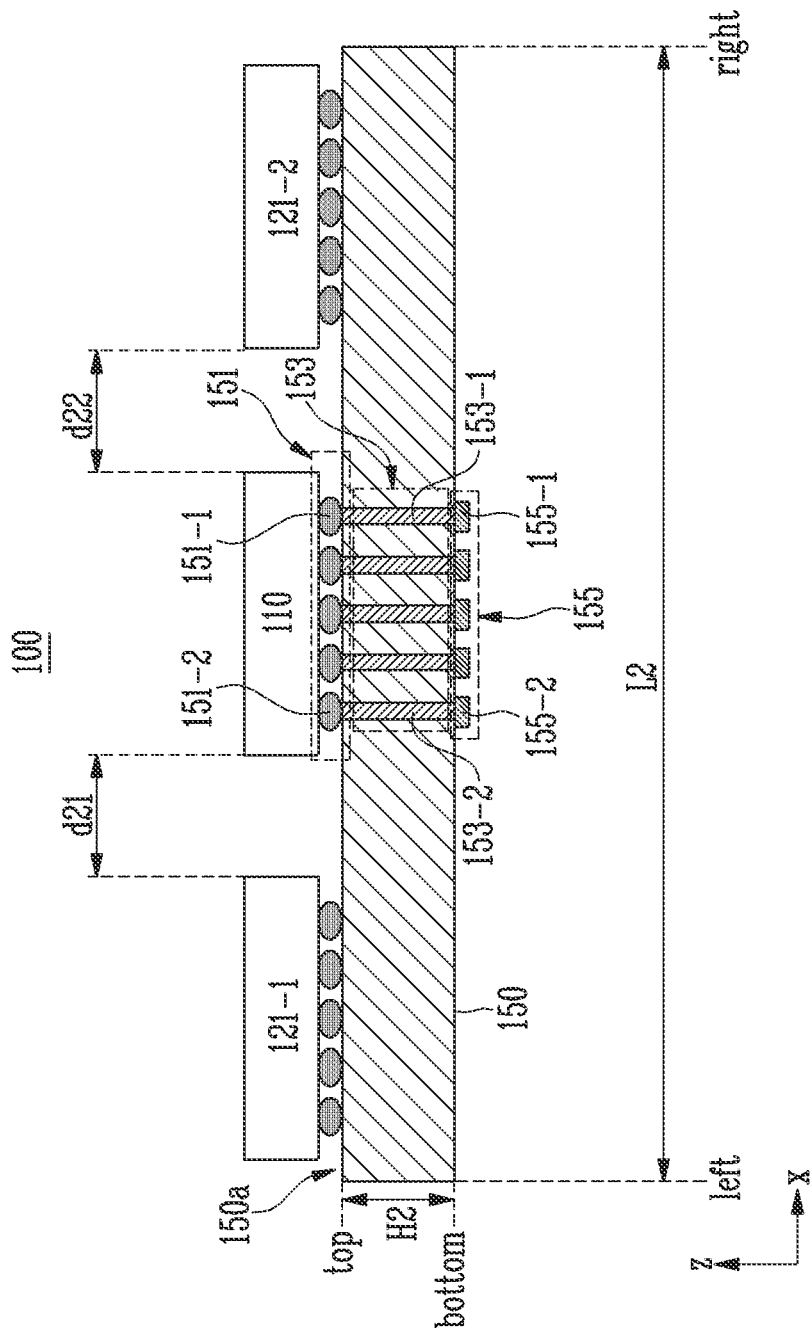
FIG. 3 is a diagram illustrating the section of a storage device according to an embodiment of the present disclosure.

FIG. 3 is a diagram illustrating the section of a storage device according to an embodiment of the present disclosure.

Referring to FIG. 3, a storage device 100 according to an embodiment of the present disclosure may include a memory controller 110, a plurality of memory devices 120 (121-1 and 121-2), and a printed circuit board (PCB) 150a. Here, the printed circuit board 150a may be a printed circuit board for a solid state drive (SSD). In relation to the memory controller 110 and the memory devices 120, repeated descriptions of overlapping components will be omitted.

The memory controller 110 may be mounted on a top surface of a substrate 150. For example, the top surface of the substrate 150 may be one of surfaces of the substrate 150 present in the height direction of the substrate 150, and a bottom surface of the substrate 150 may be the other of the surfaces of the substrate 150 present in the height direction of the substrate 150. Here, the height direction may be the z-axis direction. Moreover, "mounting on the top surface of the substrate 150" may mean that a component is fixed on the top surface in the state in which the corresponding component physically contacts the top surface of the substrate 150 or a portion (e.g., a connection terminal 151) protruding from the top surface of the substrate 150. For example, the memory controller 110 may be fixed on the top surface of the substrate 150 in the state in which the connection terminal of the memory controller 110 contacts the connection terminal 151 on the substrate 150. In this case, the memory controller 110 may be electrically connected to the connection terminal 151.

The plurality of memory devices 121-1 and 121-2 may be mounted on the top surface of the substrate 150. The plurality of memory devices 121-1 and 121-2 may be mounted on the top surface of the substrate 150 through connection terminals in the same manner as the memory controller 110. The plurality of memory devices 121-1 and 121-2 may be electrically connected to the memory controller 110 through the connection terminals and lines formed on the substrate 150.

The printed circuit board 150a may include the substrate 150, the connection terminal 151, and a first port 155.

The substrate 150 may be a plate in which lines are formed in a two-dimensional (2D) structure or a three-dimensional (3D) structure so that various electronic dements such as a resistor, a capacitor or an integrated circuit (IC) mounted on the surface of the substrate 150 are electrically connected to each other. The substrate 150 may include a conductive material, which functions as lines, and an insulating material, which insulates the lines from each other. In an embodiment, the substrate 150 may be composed of a plurality of layers.

The substrate 150 may include a conductive via 153. In the substrate 150, the conductive via 153 may be formed. The conductive via 153 may be formed in a direction perpendicular to the top surface or the bottom surface of the substrate 150. For example, the conductive via 153 may be formed in the z-axis direction.

In an embodiment, the conductive via 153 may include a plurality of conductive portions 1534 and 153-2 formed inside a via hole. Each of the conductive portions 153-1 and 153-2 may indicate a conductive material filling the via hole of the substrate 150. Here, the via hole may be an area penetrated in the z-axis direction. The conductive material may be, but is not limited to, metal such as copper, gold or nickel, or metallic compounds thereof, and may be modified into a material having an electrical conductivity of a preference value or more. The plurality of conductive portions 153-1 and 153-2 may be formed to be spaced apart from each other. An insulating material may be present between the plurality of conductive portions 153-1 and 153-2.

The plurality of conductive portions 153-1 and 153-2 may be coupled to a plurality of pins 155-1 and 155-2, respectively. The plurality of conductive portions 153-1 and 153-2 may be coupled to a plurality of bumps 151-1 and 151-2, respectively. Accordingly, the memory controller 110 mounted on the top surface of the substrate 150 and the host device 200 coupled to the bottom surface of the substrate 150 may be electrically connected to each other through the plurality of conductive portions 1534 and 153-2, the plurality of pins 1554 and 155-2, and the plurality of bumps 151-1 and 151-2.

The connection terminal 151 may be used to bond the memory controller 110 to the substrate 150, and may electrically connect the memory controller 110 and the conductive via 153 to each other. For example, when heat treatment is performed in the state in which the connection terminal 151 of the substrate 150 is brought into contact with the connection terminal of the memory controller 110, the memory controller 110 may be fixed on the top surface of the substrate 150.

The connection terminal 151 may be formed on the top surface of the substrate 150. In detail, the connection terminal 151 may be formed at the mounting location of the memory controller 110 on the top surface of the substrate 150. The mounting location of the memory controller 110 refers to the location where the memory controller 110 is designed to be mounted. The mounting location of the memory controller 110 may be the location at which the memory controller 110 is disposed between the memory devices 120.

In an embodiment, the connection terminal 151 may include the plurality of bumps 151-1 and 151-2. The plurality of bumps 151-1 and 151-2 may be formed to be spaced apart from each other. The plurality of bumps 151-1 and 151-2 may be respectively formed on the corresponding conductive portions 153-1 and 153-2, and may be electrically connected to the corresponding conductive portions 153-1 and 153-2.

The first port 155 may be formed on the bottom surface of the substrate 150. The first port 155 may electrically connect the conductive via 153 to the host device 200. In an embodiment, the first port 155 may be inserted into the second port 255 of the host device 200, and thus the first port 155 and the second port 255 may contact each other. In an example, the first port 155 may be formed in the shape of a pin protruding in a −z-axis direction. The second port 255 may be formed in the shape of a socket having a portion depressed in the −z-axis direction. In this case, the first port 155 of the storage device 100 may be inserted into the second port 255 of the host device 200 in the −z-axis direction, and may electrically contact the second port 255. Accordingly, the memory controller 110 may be electrically connected to the host device 200 to perform communication with the host device 200.

In an embodiment, the first port 155 may include the plurality of pins 155-1 and 155-2. The plurality of pins 155-1 and 155-2 may be formed to be spaced apart from each other. The plurality of pins 155-1 and 155-2 may be formed under the corresponding conductive portions 153-1 and 153-2, respectively, and may be electrically connected to the corresponding conductive portions 153-1 and 153-2.

The plurality of pins 155-1 and 155-2 may be disposed in a port area on the bottom surface of the substrate 150. The port area may correspond to an area of the top surface of the substrate 150 in which the memory controller 110 is disposed. For example, the central position of the port area on an XY plane and the central location of the area of the top surface of the substrate 150 in which the memory controller 110 is disposed may be identical to each other. In this case, the size of the port area may be equal to or less than that of the area of the top surface of the substrate 150 in which the memory controller 110 is disposed.

The length of a channel between the memory controller 110 and the host device 200 according to an embodiment of the present disclosure may be shortened compared to the conventional scheme, illustrated in FIGS. 2A and 2B.

In detail, a channel formed between the connection terminal 151 and the first port 155 according to an embodiment of the present disclosure may include the conductive via 153. In this case, the length of the channel may be a value corresponding to the length of the conductive via 153, that is, the height H2 of the substrate 150. That is, the length of the channel may be a value equal or similar to the height H2 of the substrate 150.

In the case of the conventional scheme, as illustrated in FIGS. 2A and 2B, the channel formed between the connection terminal 141 and the port 145 may include the first signal line 144-1 or include the conductive via 143 and the second signal line 144-2. In this case, the length of the channel may be the length L11 of the first signal line 144-1, or a value obtained by summing the height H1 of the substrate 140, indicating the length of the conductive via 143, and the length L12 of the second signal line 144-2.

When these schemes are compared with each other, the embodiment of FIG. 3 according to the present disclosure may shorten the length of the channel, compared to the conventional scheme. That is, in accordance with the embodiment of the present disclosure, the channel is directly formed between the memory controller 110 disposed on the top surface of the substrate 150 and the host device 200 disposed on the bottom surface of the substrate 150 through the conductive via 153, thus decreasing the loss of signals transmitted between the memory controller 110 and the host device 200 and improving a transfer rate for signals.

Hence, the length of the substrate 150 according to the embodiment of the present disclosure may be shortened compared to the length of the conventional substrate 140 illustrated in FIG. 2B. For example, the length L2 of the substrate 150 may be shorter than the length L1 of the conventional substrate 140. The conventional substrate 140 is configured such that the port 145 and the coupler 147 are formed at both ends of the substrate 140, but the substrate 150 according to the embodiment of the present disclosure is configured such that the first port 155 is formed on the bottom surface of the substrate 150 and the separate coupler 147 is not required, and thus the length of the substrate 150 may be shortened compared to the conventional substrate 140, Accordingly, a small-sized storage device 100 may be provided.

FIG. 4 is a diagram illustrating a top surface of a substrate according to an embodiment of the present disclosure.

Referring to FIG. 4, a memory controller 110 and a plurality of memory devices 120 may be mounted on the top surface of a substrate 150.

The plurality of memory devices 120 may include a first memory device 121-1 of a first channel CH1 and a second memory device 122-1 of the first channel CH1, a first memory device 121-2 of a second channel CH2, and a second memory device 122-2 of the second channel CH2, Here, the first memory device 121-1 and the second memory device 122-1 of the first channel CH1 may be memory devices coupled to the memory controller 110 through the first channel CH1, Here, the first memory device 121-2 and the second memory device 122-2 of the second channel CH2 may be memory devices coupled to the memory controller 110 through the second channel CH2.

The memory controller 110 may simultaneously communicate with the memory devices respectively coupled to different channels through channel-based interleaving. The plurality of memory devices 120 may be divided into memory device groups 120-1 and 120-2 depending on the channels. For example, the first memory device group 120-1 may include the memory devices 121-1 and 122-1 coupled to the memory controller 110 through the first channel CH1, and the second memory device group 120-2 may include the memory devices 121-2 and 122-2 coupled to the memory controller 110 through the second channel CH2, The memory controller 110 may simultaneously communicate with any memory device included in the first memory device group 120-1 and any memory device included in the second memory device group 120-2.

The memory controller 110 may be disposed between the plurality of memory devices 120 on the top surface of the substrate 150. For example, the memory controller 110 may be disposed at the center of the substrate 150. In this case, the plurality of memory devices 120 may be disposed on the left side and the right side of the memory controller 110.

Referring to FIGS. 3 and 4, the distance between one of the plurality of memory devices 120 and the memory controller 110 may be equal to the distance between the other memory device and the memory controller 110. In an example, the distance d21 between the first memory device 121-1 of the first channel CH1 and the memory controller 110 may be equal to the distance d22 between the first memory device 121-2 of the second channel CH2 and the memory controller 110. In an example, the distance d21 between the first memory device 121-1 of the first channel CH1 and the memory controller 110 may be equal to the distance d21 between the second memory device 122-1 of the first channel CH1 and the memory controller 110.

In an embodiment, the plurality of memory devices 120 may include a first memory device and a second memory device. In this case, the difference between the distance between the first memory device and the memory controller 110 and the distance between the second memory device and the memory controller 110 may be less than a reference value. The reference value may be a value indicating a fabrication error. For example, the reference value may be a value greater than 0, and may be a preset value.

In accordance with an embodiment, the first memory device and the second memory device may be electrically connected to the memory controller 110 through the same channel. In an example, the first memory device and the second memory device may be the first memory device 121-1 and the second memory device 122-1 of the first channel CH1. In an example, the first memory device and the second memory device may be the first memory device 121-2 and the second memory device 122-2 of the second channel CH2.

In accordance with an embodiment, the first memory device and the second memory device may be electrically connected to the memory controller 110 through different channels. In an example, the first memory device and the second memory device may be the first memory device 121-1 of the first channel CH1 and the first memory device 121-2 of the second channel CH2. In an example, the first memory device and the second memory device may be the second memory device 122-1 of the first channel CH1 and the second memory device 122-2 of the second channel CH2.

In accordance with an embodiment of the present disclosure, the distances between the memory controller 110 and the respective memory devices 120 may have uniform values within the range of fabrication errors. That is, channels between the memory controller 110 and the respective memory devices 120 may be formed to have uniform lengths, and thus deviations between signal characteristics (e.g., noise, speed, etc.) between the memory controller 110 and the memory devices 120 may be minimized.

Figure 5B:
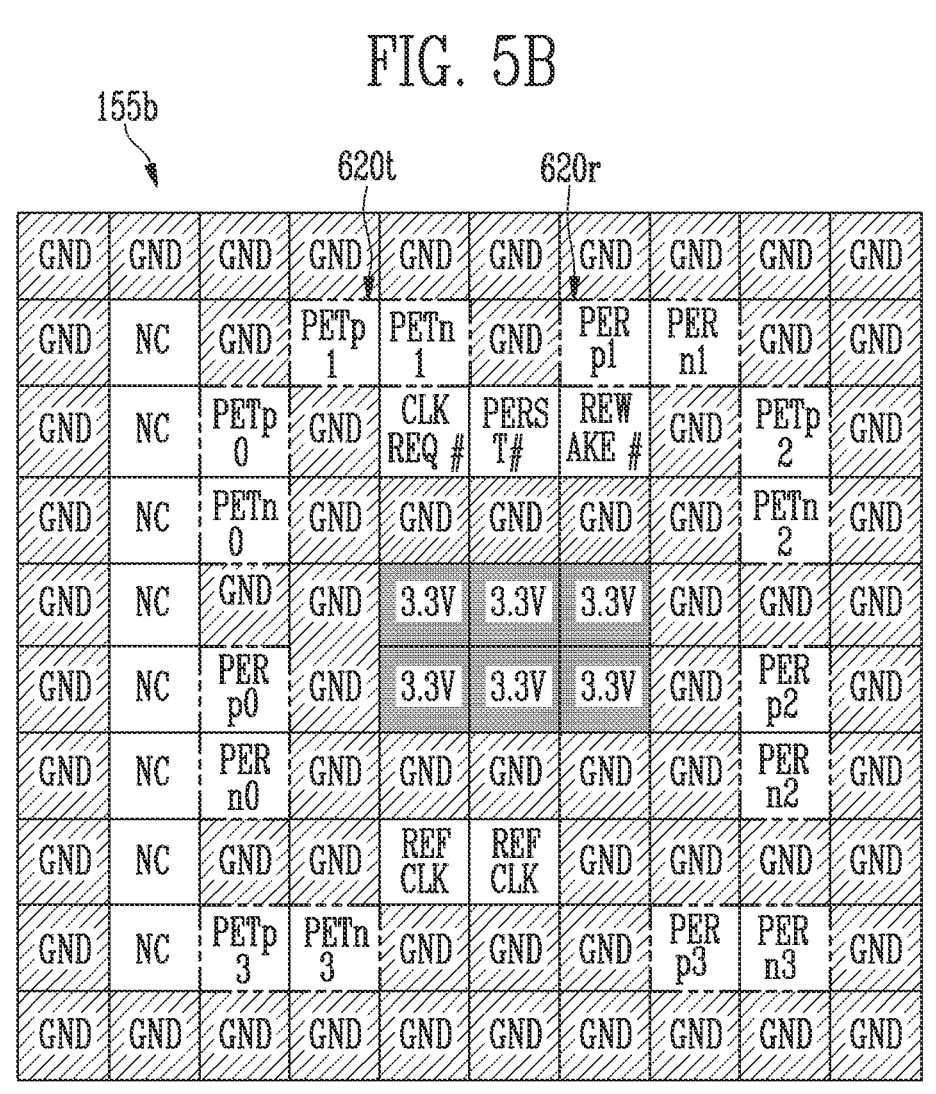

FIG. 5A is a diagram illustrating a bottom surface of a substrate and a pin array according to an embodiment of the present disclosure. FIG. 5A illustrates a view of the bottom surface of the substrate 150 and an enlarged view of a port area 155a on the bottom surface. FIG. 5B is a diagram illustrating a pin array according to an embodiment of the present disclosure.

Referring to the bottom surface of the substrate 150 in FIG. 5A, a first port 155 may be formed on the bottom surface of the substrate 150. The first port 155 may include a plurality of pins. The plurality of pins may be disposed to be spaced apart from each other.

Referring to the port area 155a in FIG. 5A, a plurality of pins 611 in the first port 155 may be disposed in the port area 155a. The port area 155a may include an inner area 610i and an edge area 610e enclosing the inner area 610i. That is, the edge area 610e may be an area located outside the inner area 610i.

In an embodiment, the plurality of pins 611 may include ground pins GND disposed in the edge area 610e, That is, in the edge area 610e, the ground pins GND may be disposed. The ground pins GND may be pins indicating a common ground. Because the ground pins GND are disposed in the edge area 610e, the influence of electromagnetic compatibility (EMC) may be minimized.

In an embodiment, the plurality of pins 611 may include a first data pin and second data pin disposed adjacent to each other in the inner area 610i, That is, the first data pin and the second data pin forming a pair may be disposed adjacent to each other in the inner area 610i. In an embodiment, both the first data pin and the second data pin forming a pair may be pins through which data signals are output. In an embodiment, both the first data pin and the second data pin forming a pair may be pins through which data signals are received.

In an embodiment, the plurality of pins may include ground pins GND disposed adjacent to the area in which the first data pin and the second data pin are disposed. That is, in an area around the pair of the first data pin and the second data pin, the ground pins GND may be disposed. The reason for this is to minimize the influence of noise (e.g. crosstalk or the like) attributable to other data pins through which data signals are input/output.

Referring to FIG. 5B, a plurality of pins may be disposed in a port area 155b. In an embodiment, each of the plurality of pins may be one of a ground pin GND, first data pins PETp0 to PETp3 and PERp0 to PERp3, second data pins PETn0 to PETn3 and PERn0 to PERn3, control pins CLKREQ #, PERST #, and REWAKE #, and a no-connection (NC) pin NC.

In an embodiment, each of the plurality of pins may be one of the first data pins PETp0 to PETp3 and PERp0 to PERp3, the second data pins PETn0 to PETn3 and PERn0 to PERn3, the control pins CLKREQ #, PERST #, and REWAKE #, a clock pin REFCLK, and the ground pin GND.

The first data pins PETp0 to PETp3 and PERp0 to PERp3 and the second data pins PETn0 to PETn3 and PERn0 to PERn3 may function as positive and negative lines. That is, a pair of one of the first data pins PETp0 to PETp3 and PERp0 to PERp3 and one of the second data pins PETn0 to PETn3 and PERn0 to PERn3 may function as one lane through which a data signal is input or output.

For example, the one of the first data pins PETp0 to PETp3 and PERp0 to PERp3 may be one of first data output pins PETp0 to PETp3 and first data input pins PERp0 to PERp3. The one of the second data pins PETn0 to PETn3 and PERn0 to PERn3 may be one of second data output pins PETn0 to PETn3 and second data input pins PERn0 to PERn3. In this case, a pair of one of the first data output pins PETp0 to PETp3 and one of the second data output pins PETn0 to PETn3 may function as one data output lane. A pair of one of the first data input pins PERp0 to PERp3 and one of the second data input pins PERn0 to PERn3 may function as one data input lane.

The control pins CLKREQ #, PERST #, and REWAKE # may be pins through which a clock control signal or a reset control signal is received.

The clock pin REFCLK may be a pin through which a reference clock signal provided by the host device 200 is received.

The no-connection (NC) pin NC may be a pin that is not connected to an internal circuit. The NC pin NC may float or may be grounded.

Figure 6:
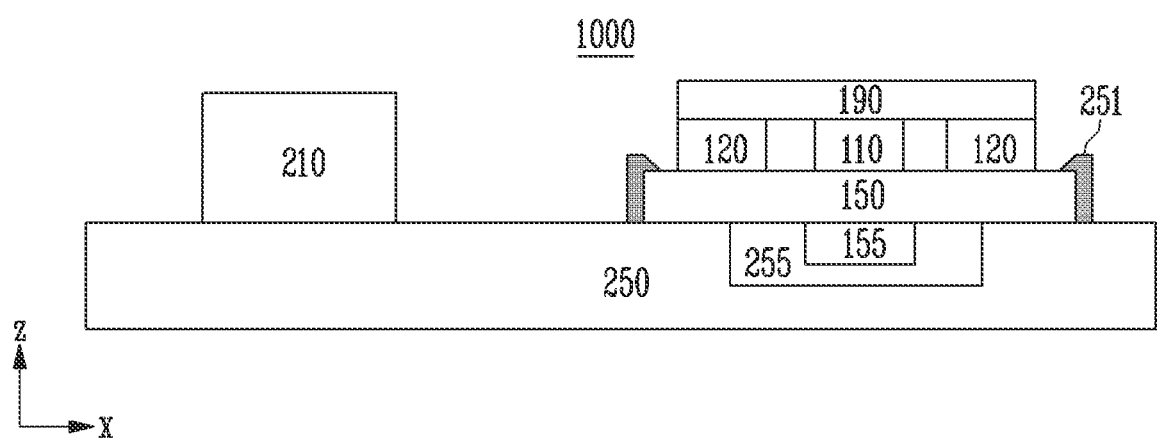
FIG. 6 is a diagram illustrating a storage device coupled to a host device according to an embodiment of the present disclosure.

FIG. 6 is a diagram illustrating a storage device coupled to a host device according to an embodiment of the present disclosure.

Referring to FIG. 6, an electronic device 1000 may include a storage device 100 coupled to a host device 200.

A main substrate 250 of the host device 200 may include a fastening portion 251 and a second port 255. A central processing unit 210 may be mounted on the main substrate 250. The main substrate 250 may be a plate in which lines are formed in a two-dimensional (2D) structure or a three-dimensional (3D) structure so that various electronic elements such as a resistor, a capacitor or an integrated circuit (IC) mounted on the surface of the main substrate 250 are electrically connected to each other.

The second port 255 may be electrically connected to a first port 155 of the storage device 100. The fastening portion 251 may fix the storage device 100 in the state in which the first port 155 and the second port 255 are connected to each other.

The central processing unit 210 of the host device 200 may transmit or receive various signals to or from the memory controller 110 of the storage device 100 through the second port 255 and the first port 155.

The storage device 100 according to an embodiment of the present disclosure may further include a heat dissipation plate 190. The heat dissipation plate 190 may be attached to the top of at least one of the plurality of memory devices 120 and the memory controller 110, The heat dissipation plate 190 may conduct heat of the memory controller 110 or the memory devices 120 and emit the heat to the outside of the storage device.

In accordance with the embodiment of the present disclosure, there can be provided the storage device 100 and the printed circuit board 150a, which may minimize signal loss and improve a transfer rate.

In an embodiment, signal loss may be minimized and a transfer rate may be improved by shortening the length of a channel between the storage device 100 and the host device 200.

In an embodiment, there can be provided the storage device 100 and the printed circuit board 150a, which are miniaturized.

In an embodiment, channels between the memory controller 110 and the memory devices 120 may be formed to have a uniform length. Accordingly, there can be provided the storage device 100 in which the memory controller 110 and the memory devices 120 communicate with each other at a uniform speed.

In accordance with the present disclosure, there can be provided a storage device and a printed circuit board for a solid state drive, which minimize signal loss and improve a transfer rate.

In an embodiment, signal loss may be minimized and a transfer rate may be improved by shortening the length of a channel between a storage device and a host device.

In an embodiment, there can be provided a storage device and a printed circuit board, which are miniaturized.

In an embodiment, channels between a memory controller and a memory device may be formed to have a uniform length.

Based on embodiments of the present disclosure described above, signal loss may be minimized and a transfer rate may be improved by shortening the length of a channel between a storage device and a host device. Although various embodiments of the present disclosure have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A storage device, comprising:
    a substrate including a conductive via;
    a plurality of memory devices mounted on a top surface of the substrate;
    a memory controller mounted on the top surface of the substrate and electrically connected to the conductive via; and
    a port formed on a bottom surface of the substrate and electrically connected to the conductive via and a host device,
    wherein the port includes a plurality of pins disposed in a port area of the bottom surface of the substrate, the port area opposing, across the substrate, an area of the top surface in which the memory controller is disposed.

2. The storage device according to claim 1, wherein the plurality of pins are spaced apart from each other.

3. The storage device according to claim 2, wherein:
    the port area includes an inner area and an edge area enclosing the inner area, and
    the plurality of pins include ground pins disposed in the edge area.

4. The storage device according to claim 3, wherein the plurality of pins include a first data pin and a second data pin disposed adjacent to each other in the inner area.

5. The storage device according to claim 4, wherein the plurality of pins further include ground pins disposed adjacent to an area in which the first data pin and the second data pin are disposed.

6. The storage device according to claim 2, wherein each of the plurality of pins is one of a ground pin, a data pin, a control pin, and a clock pin.

7. The storage device according to claim 2, wherein:
    the conductive via is formed in a direction perpendicular to the top surface or the bottom surface, and
    the conductive via includes a plurality of conductive portions to be coupled to the respective pins.

8. The storage device according to claim 1, wherein the memory controller is disposed between the plurality of memory devices.

9. The storage device according to claim 8, wherein distances from the memory controller to each of the plurality of memory devices are the same as one another.

10. The storage device according to claim 8, wherein:
    the plurality of memory devices comprise a first memory device and a second memory device, and
    a difference in distances from the memory controller to each of the first memory device and the second memory device is less than a reference value.

11. The storage device according to claim 10, wherein the first memory device and the second memory device are electrically connected to the memory controller through an identical channel.

12. The storage device according to claim 10, wherein the first memory device and the second memory device are electrically connected to the memory controller through different channels.

13. The storage device according to claim 1, further comprising a heat dissipation plate attached to a top of at least one of the plurality of memory devices and the memory controller.

14. A printed circuit board for a solid state drive, comprising:
    a substrate including a conductive via;
    a connection terminal formed on a top surface of the substrate to electrically couple the conductive via and a memory controller to each other; and
    a port formed on a bottom surface of the substrate to electrically couple the conductive via and a host device to each other,
    wherein the port includes a plurality of pins disposed in a port area of the bottom surface of the substrate, the port area opposing, across the substrate, an area of the top surface in which the memory controller is disposed.

15. The printed circuit board according to claim 14, wherein the plurality of pins are spaced apart from each other.

16. The printed circuit board according to claim 15, wherein:
    the port area includes an inner area and an edge area enclosing the inner area, and
    the plurality of pins include ground pins disposed in the edge area.

17. The printed circuit board according to claim 16, wherein the plurality of pins include a first data pin and a second data pin disposed adjacent to each other in the inner area.

18. The printed circuit board according to claim 17, wherein the plurality of pins further include ground pins disposed adjacent to an area in which the first data pin and the second data pin are disposed.

19. The printed circuit board according to claim 15, wherein each of the plurality of pins is one of a ground pin, a data pin, a control pin, and a clock pin.

20. The printed circuit board according to claim 15, wherein:
    the conductive via is formed in a direction perpendicular to the top surface or the bottom surface, and
    the conductive via includes a plurality of conductive portions to be coupled to the respective pins.

* * * * *